(12) United States Patent
Gachon et al.

(10) Patent No.: US 10,664,423 B2
(45) Date of Patent: May 26, 2020

(54) DIGITAL PROCESSING DEVICE WITH HIGH CONNECTIVITY AND INCOMING/OUTGOING THROUGHPUT EMBEDDED ABOARD A SPACE PLATFORM AND SPLIT UP INTO MUTUALLY INTERCONNECTED MODULAR PROCESSING ISLETS WHICH ARE REMOTE FROM ONE ANOTHER ON THE SCALE OF THE PLATFORM

(71) Applicant: THALES, Courbevoie (FR)

(72) Inventors: Hélène Gachon, Toulouse (FR); Norbert Venet, Toulouse (FR)

(73) Assignee: THALES, Courbevoie (FR)

( * ) Notice: Subject to any disclaimer, the term of this patent is extended or adjusted under 35 U.S.C. 154(b) by 0 days.

(21) Appl. No.: 15/987,663

(22) Filed: May 23, 2018

(65) Prior Publication Data
US 2018/0341604 A1 Nov. 29, 2018

(30) Foreign Application Priority Data
May 24, 2017 (FR) ..................................... 17 00550

(51) Int. Cl.
*G06F 13/38* (2006.01)
*G06F 13/40* (2006.01)
(Continued)

(52) U.S. Cl.
CPC ............... *G06F 13/20* (2013.01); *B64G 1/10* (2013.01); *B64G 1/66* (2013.01); *G02B 6/4452* (2013.01);
(Continued)

(58) Field of Classification Search
CPC .......... G06F 13/38; G06F 13/40; H04B 7/185
See application file for complete search history.

(56) References Cited

U.S. PATENT DOCUMENTS 5,950,965 A 9/1999 Epstein et al.
6,220,548 B1 * 4/2001 Hyman ................. B64G 1/503
244/172.6
(Continued)

FOREIGN PATENT DOCUMENTS

WO 2016/034883 A1 3/2016

OTHER PUBLICATIONS

N. Venet et al., "High-Throughput Optical Inter-Board Interconnects for Next-Generation On-board Digital Transparent Processors," Proceedings of the ISCO 2014 (International Conference on Space Optics), Tenerife, Canary Islands, Spain, Oct. 7-10, 2014.
(Continued)

*Primary Examiner* — David E Martinez
(74) *Attorney, Agent, or Firm* — Baker & Hostetler LLP

(57) ABSTRACT

A digital processing device with high input/output connectivity and modular architecture comprises a first plurality of input ports, a second plurality of output ports, and a third plurality of at least four basic elementary modules. The third plurality of the elementary modules is split up according to a partitioning of at least two sub-assemblies of module(s), at least two of which form different islets comprising at least two modules. The digital processing device comprises a harness of optical links for mutually interconnecting the sub-assemblies of modules whose interconnection lengths are compatible with interconnection runs between two interconnected islets which make it possible to avoid, by sidestepping, one or more items of equipment external to the digital processing device, and which are installed on a space platform and interposed between the two interconnected islets, or which make it possible to distribute at least two interconnected islets over two heat exchange zones of the space platform that are far separated by a separation distance on the scale of the size of the platform.

11 Claims, 3 Drawing Sheets

(51) Int. Cl.
  *H04B 7/185* (2006.01)
  *G06F 13/20* (2006.01)
  *B64G 1/66* (2006.01)
  *H05K 7/20* (2006.01)
  *G02B 6/44* (2006.01)
  *H04B 10/80* (2013.01)
  *B64G 1/10* (2006.01)

(52) U.S. Cl.
  CPC ..... *G06F 13/4027* (2013.01); *H04B 7/18515* (2013.01); *H04B 10/801* (2013.01); *H05K 7/20845* (2013.01)

(56) References Cited

U.S. PATENT DOCUMENTS

| | | | | |
|---|---|---|---|---|
| 7,184,272 | B1* | 2/2007 | Harlacher | H01R 24/40 361/728 |
| 2004/0188568 | A1* | 9/2004 | Gayrard | B64G 1/506 244/171.8 |
| 2008/0289801 | A1 | 11/2008 | Batty et al. | |
| 2010/0260198 | A1* | 10/2010 | Rojas-Cessa | H04L 49/1515 370/417 |
| 2017/0279521 | A1* | 9/2017 | Hughes | H04B 17/00 |

OTHER PUBLICATIONS

H. Gachon et al., "Digital processor for telecommunication payload," Proceedings of 2nd ESA workshop on Advanced Flexible Telecom Payloads, Apr. 2012.

P. Tabacco et al., "Development & testing of a proof-of-concept real-time demonstrator representing a wideband Bent-Pipe on board Processor with beam forming," Proceedings of an ESA workshop, 2012.

MacManus et al., "Digital Beam-forming applicable to C, Ku and Ka bands," Proceedings of the 3rd ESA Workshop on Advanced Flexible Telecom Payloads, Mar. 21-24, 2016.

H. Gachon et al., "Spaceflex Digital Transparent Processor for Advanced Flexible Payloads," Proceedings of 3rd ESA Workshop on Advanced Flexible Telecom Payloads, Mar. 2016.

* cited by examiner

DIGITAL PROCESSING DEVICE WITH HIGH CONNECTIVITY AND INCOMING/OUTGOING THROUGHPUT EMBEDDED ABOARD A SPACE PLATFORM AND SPLIT UP INTO MUTUALLY INTERCONNECTED MODULAR PROCESSING ISLETS WHICH ARE REMOTE FROM ONE ANOTHER ON THE SCALE OF THE PLATFORM

CROSS-REFERENCE TO RELATED APPLICATIONS

This application claims priority to foreign French patent application No. FR 1700550, filed on May 24, 2017, the disclosure of which is incorporated by reference in its entirety.

FIELD OF THE INVENTION

The present invention relates to a digital processing device with high connectivity and incoming/outgoing data throughput, able to be embedded aboard a space platform, especially that of a satellite, and exhibiting a modular architecture.

The present invention also relates to an architecture for installing or laying out the said digital processing device within the space platform, compatible with the required physical performance of the digital processing device and the physical constraints, especially mechanical, thermal and electromagnetic compatibility constraints, which are fixed by the space platform and by a predetermined number of other items of equipment fixed on the said space platform.

BACKGROUND

A digital processing device with high connectivity and incoming/outgoing throughput is an entirely digital processor of digital computer type or a processor including at input one or more ADC components for converting an analogue signal to a digital signal (ADC for Analogue to Digital Converter) and/or at output one or more DAC components for converting a digital signal to an analogue signal (DAC for Digital to Analogue Converter) and entirely digital components for the remainder of the components.

The digital processing device can be in particular a Digital Transparent Processor (DTP) one function of which is to provide flexibility in terms of connectivity, channelization and frequency plan. The digital transparent processor DTP is not limited to a particular application and can be used equally for mobile applications and telecommunications applications when a requirement for flexibility is demanded of the frequency plan. In addition to the frequency plan flexibility allowed by the functionalities of this processor, a modular design of the processor is made possible in which flexibility is achieved as a function of the size of the connectivity matrix associated with each mission.

Numerous modular architectures of digital processors of various sizes entailing their connectivity matrices have been described in numerous documents. Some of these architectures have even been developed, tested and qualified for space applications.

These architectures are described for example in the following documents:

a first document by H. Gachon et al., entitled "Digital processor for telecommunication payload", published in the Proceedings of 2nd ESA workshop on Advanced Flexible Telecom Payloads, April 2012, a second document by P. Tabacco et al., entitled "Development & testing of a proof-of-concept real-time demonstrator representing a wideband Bent-Pipe on board Processor with beam forming", published in the proceedings of an ESA workshop, 2012, a third document by N. MacManus et al., entitled "Digital Beam-forming applicable to C, Ku and Ka bands", published in the Proceedings of the 3rd ESA Workshop on Advanced Flexible Telecom Payloads, 21-24 Mar. 2016, and a fourth document by H. Gachon et al., entitled "Spaceflex Digital Transparent Processor For Advanced Flexible Payloads" and published in the Proceedings of 3rd ESA Workshop on Advanced Flexible Telecom Payloads.

All these architectures are constructed on the basis of the definition of one or more unit generic modules or "basic bricks", and of a modular assemblage of several unit modules making it possible to produce connectivity matrices of variable size of possibly as many as a hundred infeeds. The unit modules of this assemblage are grouped together in a compact and local manner. For this assemblage, optical links of short lengths have been developed to solve the equipment backplane connection issue related to the limitations of conventional links by electrical cables in terms of paucity of transmission throughput and/or of excessive bulk.

However, faced with the requirements of growing connectivity in terms of an ever larger number of infeeds of the connectivity matrix and/or of an ever larger band processed per infeed, i.e. of a larger total capacity, this translating into a larger throughput to be routed over a greater distance, greater mass, bulk, and thermal power to be dissipated of the item of equipment, current equipment architectures lead to incompatibilities of mechanical installation, thermal installation and of electromagnetic compatibility of the said item of equipment in relation to the space platform and the remaining items of equipment to be integrated on the same platform.

The technical problem is to increase the number and/or the throughput of input ports and of output ports and/or the input/output connectivity of a digital processing device and, in conjunction with the increase created in bulk, in mass and in thermal dissipation of the device, to increase the flexibility of installation of the said processing device within a predetermined space platform so as to render it compatible with the physical constraints, especially mechanical, thermal and electromagnetic compatibility constraints, which are fixed by the said space platform and by a predetermined number of other items of equipment fixed on the same platform.

The second technical problem is to render minimal the increase in mass brought about by the flexibility of installation afforded to the device in relation to the space platform.

SUMMARY OF THE INVENTION

For this purpose, a subject of the invention is a digital processing device, intended to be embedded aboard a space platform, with high input/output connectivity, and having a multi-module modular architecture based on the use of one or more generic types of basic elementary modules, on one or more predetermined functionalities and on a connectivity matrix of predetermined size.

The digital processing device comprises: a first plurality of input ports, a second plurality of output ports, and a third plurality of at least four basic elementary modules.

The digital processing device is characterized in that:

the third plurality of the elementary modules is split up according to a partitioning of at least two sub-assemblies of module(s), each sub-assembly of module(s) comprising one or more elementary module(s) and a different monobloc mechanical structure in which the elementary module or modules are integrated; and at least two sub-assemblies of modules of the partitioning of the third plurality are sub-assemblies of at least two modules each defining a different islet of modules; and the digital processing device comprises a harness of optical links for mutually interconnecting the sub-assemblies of modules whose interconnection lengths are compatible with interconnection runs between two interconnected islets which make it possible to avoid, by sidestepping, one or more items of equipment external to the digital processing device, and which are installed on the space platform and interposed between the two interconnected islets, and/or which make it possible to distribute at least two interconnected islets over two heat exchange zones of the space platform that are far separated by a separation distance on the scale of the size of the platform.

According to particular embodiments, the digital processing device comprises one or more of the following characteristics:

at least one external interconnection length of the optical harness between two islets of modules lies between 1 metre and 50 metres, preferably between 1 and 7 metres;

the third plurality of the elementary modules is split up according to a partitioning of at least two sub-assemblies of module(s), the partitioning containing at least two islets, the partitioning being determined so as to distribute the mass and the thermal power of the digital processing device over at least two heat exchange zones of the space platform that are far separated by a separation distance on the scale of the size of the space platform;

the third plurality of the elementary modules is split up according to a partitioning containing only islets;

the throughput per input port and per output port is high and lies between 6 Mb/s and 100 Mb/s, and/or the number ne of input ports lies between 8 and 200, and the number ns of output ports lies between 8 and 200, and/or the number of modules lies between 2 and 100, and/or the number of islets lies between 1 and 10;

the digital processing device comprises at least two generic types of basic elementary modules, or a single generic type of basic elementary modules;

the digital processing device is a processor included in the assembly formed by entirely digital processors of digital computer type, and the processors including at input one or more ADC components for converting an analogue signal to a digital signal and/or at output one or more DAC components for converting a digital signal to an analogue signal and entirely digital components for the remainder of the components;

the digital processing device is configured to be a digital transparent processor DTP a function of which is to provide flexibility in terms of connectivity, channelization and frequency plan;

the harness of external optical interconnection links of the islets is formed by optical fibres which are separated or grouped together by ribbon of about ten optical linkups.

A subject of the invention is also an installed space platform comprising a digital processing device such as defined hereinabove.

According to particular embodiments, the installed platform comprises one or more of the following characteristics:

the space platform comprises a first heat exchange panel and a second heat exchange panel, mutually separated by one or more floors, and in which the islets of the digital processing device are distributed over the first heat exchange panel and the second heat exchange panel, and are separated by an optical interconnection harness whose run passes through at least one floor over its length.

BRIEF DESCRIPTION OF THE DRAWINGS

The invention will be better understood on reading the description of several embodiments which will follow and which is given solely by way of example while referring to the drawings in which.

DETAILED DESCRIPTION

Figure 1:
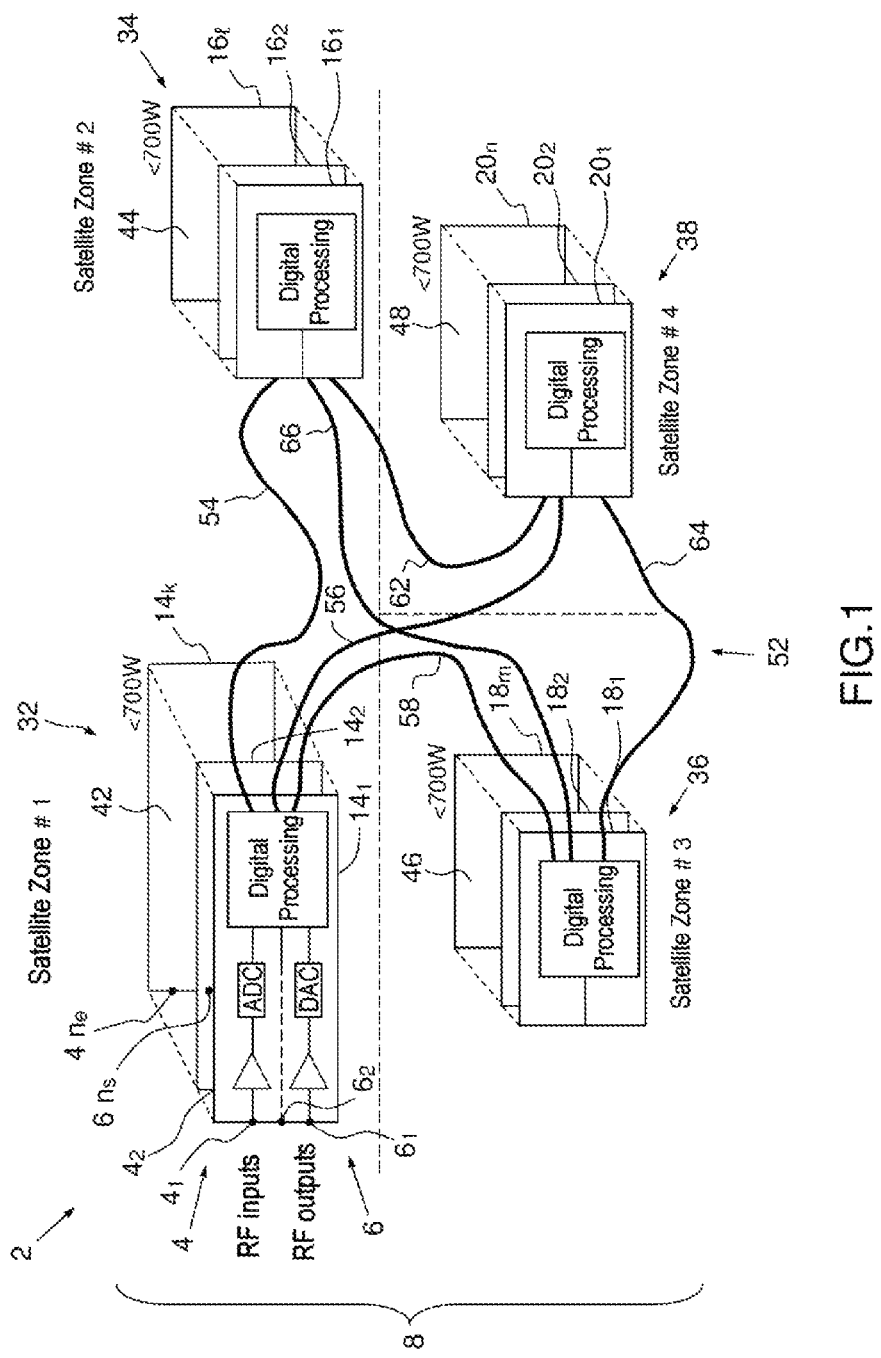
FIG. 1 is a view of an exemplary modular architecture of a digital processing device carrying out here typically the functionalities of a satellite digital transparent processor.

A first concept underlying the invention is to distribute the mass and the thermal power to be dissipated of the digital processing device over several support and thermal regulation zones of the space platform, mutually separated by possibly large distances, while guaranteeing compliance with the connectivity and throughput requirements. This distributing of mass and thermal power is achieved by splitting up the initial conventional digital processing device, physically concentrated in one and the same spatial zone and integrated into one and the same mechanical block, and its associated functionalities, into several islets-devices with their respective functional sub-assemblies, with no constraint on the number of islets, nor their spacing distances, nor their positioning on the space platform, each islet-device being integrated into a different mechanical block.

A second concept underlying the invention is to replace the electrical connection harnesses between the various islets by external optical harnesses.

Thus, the constraints of installing the digital processing device on the space platform are solved by distributing the function or functions to be carried out over several zones of the space platform so as not to concentrate the mass and the dissipation thereof, doing so without any constraint on distance between the various blocks, nor on number of blocks.

Thus, the architecture of the digital processing device according to the invention makes it possible to remove the obstacle of installation on the space platform, by making it possible to carry out the function of the digital processing device, no longer as a single item of equipment in the sense of a single monobloc integrated mechanical assembly, but as several mechanical islets-blocks, with no constraint either on the number of islets-blocks, or on the distances separating these islets-blocks, and with no impact on performance, that is to say without modifying the RF performance of the digital processing device and without over-dimensioning the platform or the other payload items of equipment on board the space platform.

Thus, the use of external optical links makes it possible to split up the mechanically monobloc digital processing device into several monobloc or islet-block sub-assemblies and to interconnect the said islets-blocks through interfaces of external interconnection digital cards provided for this purpose. These external optical links can exploit the developments, already performed to achieve the connection setup internal to an item of equipment in the sense of a function carried out in one and the same mechanical assembly, and described in the article by N. Venet et al., entitled "High-Throughput Optical Inter-Board Interconnects for Next-Generation On-board Digital Transparent Processors" and published in the Proceedings of the ISCO 2014 (International Conference on Space Optics), Tenerife, Canary Islands, Spain, 7-10 Oct. 2014.

The other advantages are a drastic reduction in the mass and in the volume of the harnesses, as well as an improvement in EMC performance.

According to FIG. 1 and an exemplary embodiment of a digital processing device according to the invention, a digital processing device 2 comprises a first plurality 4 of input ports $4_1, 4_2, \ldots, 4_{ne}$, a second plurality 6 of output ports $6_1, 6_2, \ldots, 6_{ns}$, and a third plurality 8 of at least four basic elementary modules.

The digital processing device 2 is configured to be embedded aboard a space platform, here a satellite platform, not represented in FIG. 1.

The digital processing device 2 exhibits high input/output connectivity, dependent on the size of the connectivity matrix associated therewith.

The digital processing device 2 comprises a multi-module modular architecture based on the use of several generic types of basic elementary modules, here two generic types 10 and 12 for simplicity, on several predetermined functionalities, and on a connectivity matrix of predetermined size.

Here, the digital processing device 2 is in a particular manner a Digital Transparent Processor DTP, functionalities of which are to provide flexibility in terms of connectivity, channelization and frequency plan.

Here and in a simplified manner, the digital processing device 2 comprises a first generic type 10 of identical basic elementary modules $14_1, 14_2 \ldots, 14_k$, k being an integer greater than or equal to 3, each having at input several ADC components for converting an analogue signal to a digital signal and at output several DAC components for converting a digital signal to an analogue signal, placed in parallel and connected respectively to the input ports $4_1, 4_2, \ldots, 4_{ne}$ and to the output ports $6_1, 6_2, \ldots, 6_{ns}$, and each having one or more digital components 18 for the remainder of the components. The basic elementary modules $14_1, 14_2 \ldots, 14_k$ are here modules for managing the RF inputs/outputs and their analogue-digital or digital-analogue conversions.

Here and in a simplified manner, the digital processing device 2 comprises a second generic type 12 of identical basic elementary modules $16_1, 16_2, \ldots 16_l, 18_1, 18_2, 18_3, \ldots, 18_m, 20_1, 20_2, \ldots, 20_n$, l, m, and n being integers each greater than or equal to 3, each having digital components. Here, the identical basic elementary modules $16_1, 16_2, \ldots 16_l, 18_1, 18_2, 18_3, \ldots, 18_m, 20_1, 20_2, \ldots, 20_n$ are switching and routing modules.

The third plurality 8 of the elementary modules is partitioned here into four sub-assemblies 32, 34, 36, 38.

The first sub-assembly 32 comprises the k elementary modules $14_1, 14_2 \ldots, 14_k$ of first type 10 which are grouped together and integrated into a first monobloc mechanical structure 42.

The second sub-assembly 34 comprises the l elementary modules $16_1, 16_2, \ldots 16_l$ of second type 12 which are grouped together and integrated into a second monobloc mechanical structure 44.

The third sub-assembly 36 comprises the m elementary modules $18_1, 18_2, 18_3, \ldots, 18_m$ of second type 12 which are grouped together and integrated into a third monobloc mechanical structure 46.

The fourth sub-assembly 38 comprises the n elementary modules $20_1, 20_2, \ldots, 20_n$ of second type 12 which are grouped together and integrated into a fourth monobloc mechanical structure 48.

An islet of modules being defined as a sub-assembly of at least two modules integrated into one and the same monobloc mechanical structure, the four sub-assemblies 32, 34, 36, 38 form four islets here.

The digital processing device 2 comprises a harness 52 of optical links 54, 56, 58, 62, 64, 66, for mutual external interconnection of the sub-assemblies of modules 32, 34, 36, 38.

The interconnection lengths of the external optical links are compatible with interconnection runs between any two interconnected islets. They make it possible to avoid, by sidestepping, one or more items of equipment external to the digital processing device, and which are installed on the space platform and interposed between the two interconnected islets, or make it possible to distribute at least two interconnected islets over two heat exchange zones of the space platform that are far separated by a separation distance on the scale of the size of the platform.

At least one external interconnection length of the optical harness 52 between two islets of modules lies between 1 metre and 50 metres, preferably between 1 and 7 metres, typically 4 metres.

Here, the digital processing device 2 is assumed to have to dissipate a thermal power of more than 2 kW and less than 3 kW.

The digital processing device 2 is split up into the four sub-assemblies 32, 34, 36, 38, forming islets and distributed respectively over a first zone, a second zone, a third zone and a fourth zone of the space platform.

The four sub-assemblies 32, 34, 36, 38 are configured to each dissipate a thermal power of less than 700 W, typically considered to be a thermal power threshold not to be exceeded over each of the zones of the space platform in order to guarantee effective operation of the thermal management of the platform.

The connection setup between the four sub-assemblies 32, 34, 36, 38 represents a number of more than 2200 links to be routed through the space platform.

Conventional installation of two sub-assemblies, spaced a few decimetres apart and interconnected by a harness of 200 electrical links, leading to a mass of this harness of the order of 64 kg, the use of an electrical harness is crippling in the case of routing 2200 links. Furthermore, the use of an electrical harness limits the length of the links to 1.5 m, and guarantees neither compliance with the performance requirements of the digital processing device, nor compliance with the constraints for routing the payload through the other items of equipment.

In an advantageous manner, installation using an optical harness reduces the net mass to only 5 kg for equal length and equal throughput of data of the 200 electrical links considered in the conventional case, without limiting the length of the linkups which may easily exceed three metres and may offer the maximum possible flexibility of installation.

Furthermore, the optical fibres may be grouped together by ribbons of about ten linkups, a ribbon of about ten linkups being equivalent in terms of bulk to an electrical cable of a single linkup. This correspondingly simplifies the complexity of routing and removes the obstacle of the processing capacity with no impact on the number of linkups to be routed: for equivalent bulk, the processing capacity is multiplied by 20 with respect to the processing capacity at present.

The external optical links make it possible to guarantee links of several metres with very little loss, just where electrical linkups are limited in terms of length and throughput transmitted. Moreover, optical links are twenty times less massive in Gb/s per linear metre than the electrical cables available at present. Moreover the use of external optical links is irrelevant in relation to the electromagnetic compatibility EMC constraints.

Generally, a digital processing device according to the invention, intended to be embedded aboard a space platform and with high input/output connectivity, comprises a modular architecture, this modular architecture being based on the use of one or more generic types of basic elementary modules, on one or more predetermined functionalities and on a connectivity matrix of predetermined size.

The digital processing device comprises a first plurality of input ports, a second plurality of output ports, and a third plurality of at least four basic elementary modules.

The third plurality of the elementary modules is partitioned into at least two sub-assemblies of module(s). Each sub-assembly of module(s) comprises one or more elementary module(s) and a different monobloc mechanical structure in which the said elementary module or modules are integrated.

At least two sub-assemblies of modules of the partitioning of the third plurality are each a sub-assembly of at least two modules defining a different islet of modules.

The digital processing device according to the invention comprises a harness of external optical links for mutually interconnecting the sub-assemblies of modules.

The interconnection lengths of the external optical links are compatible with interconnection runs between interconnected islets which make it possible to avoid, by sidestepping, one or more items of equipment external to the digital processing device, and which are installed on the space platform and interposed between the two interconnected islets, or which make it possible to distribute at least two interconnected islets over two heat exchange zones of the space platform that are far separated by a separation distance on the scale of the size of the platform.

In a particular manner, the third plurality of the elementary modules is split up according to a partitioning of at least two sub-assemblies of module(s) containing at least two islets. The partitioning is determined so as to distribute the mass and the thermal power of the processing device over at least two heat exchange zones of the space platform that are far separated by a separation distance on the scale of the size of the space platform.

As a variant, the third plurality of the elementary modules is partitioned into a partitioning containing only islets.

The throughput per input port and per output port is high and lies between 6 Mb/s and 100 Mb/s.

The number of input ports lies between 8 and 200, and the number of output ports lies between 8 and 200.

The number of modules lies between 2 and 100, and/or the number of islets lies between 1 and 10.

In a particular manner, the digital processing device comprises at least two generic types of basic elementary modules, or a single generic type of basic elementary modules.

Generally, the digital processing device is a processor included in the assembly formed by entirely digital processors of digital computer type, and the processors including at input one or more ADC components for converting an analogue signal to a digital signal and/or at output one or more DAC components for converting a digital signal to an analogue signal and entirely digital components for the remainder of the components.

Figure 2:
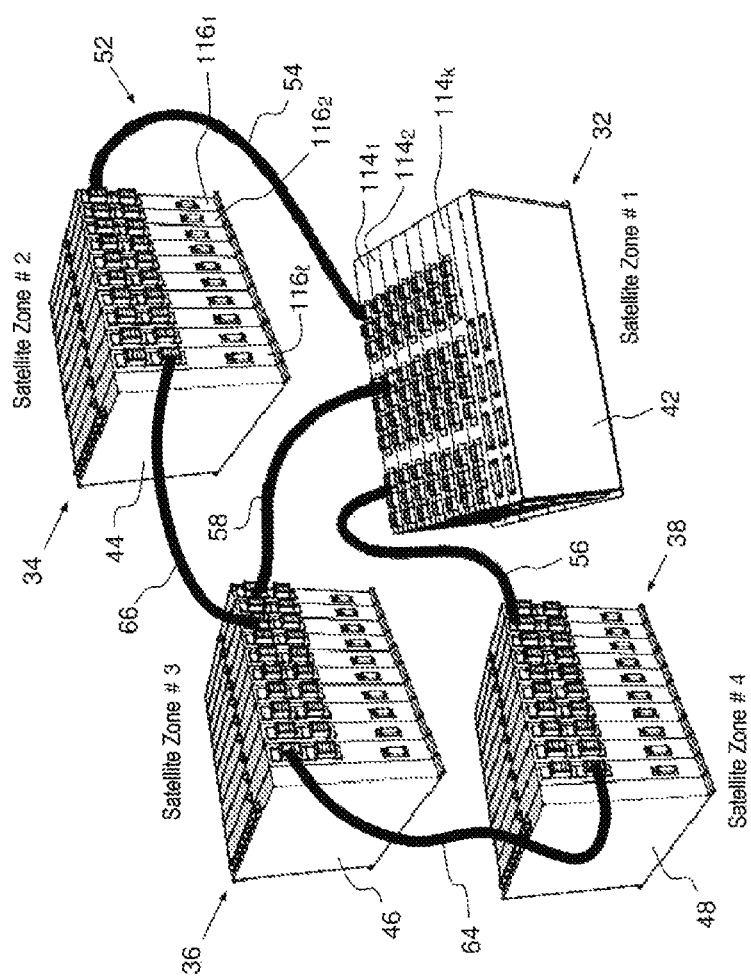
FIG. 2 is a physical view of the digital processing device of FIG. 1 split up into compact mutually remote islets of modules, the islets being linked together by a harness of external optical links.

According to FIG. 2, an example of the first, second, third, fourth monobloc mechanical structures 42, 44, 46, 48, associated respectively with the first, second, third, fourth modular sub-assemblies 32, 34, 36, 38 of the digital processing device 2 of the figure, is illustrated in detail.

Each monobloc mechanical structure 42, 44, 46, 48 consists of metal housings sheltering in the form of individual sections, screwed together side-by-side, the corresponding modules.

For example, the k elementary modules $14_1, 14_2 \ldots, 14_k$ of first type 10 of the first sub-assembly 32 are each integrated into respective metal housings $114_1, 114_2 \ldots, 114_k$ forming k leaktight sections. The metal housings $114_1, 114_2 \ldots, 114_k$ are aligned side by side and fixed together, for example by screwing, to form the first monobloc mechanical structure 42.

For example, the l elementary modules $16_1, 16_2 \ldots, 16_k$ of second type 12 of the second sub-assembly 34 are each integrated into metal housings $116_1, 116_2 \ldots, 116_l$ forming l leaktight sections. The metal housings $116_1, 116_2 \ldots, 116_l$ are aligned side by side and fixed together, for example by screwing, to form the second monobloc mechanical structure 44.

The third and fourth monobloc mechanical structures 46, 48 are produced and arranged in an analogous manner to the second monobloc structure 44, only the integers m, n being able to differ from the integer l.

According to FIG. 3, an installed space platform 202 comprises the digital processing device 2 such as described hereinabove and an assembly of items of payload equipment, not represented in FIG. 3.

The installed space platform 202 comprises a first heat exchange panel 204 and a second heat exchange panel 206, mutually separated by one or more floors 212, 214.

Figure 3:
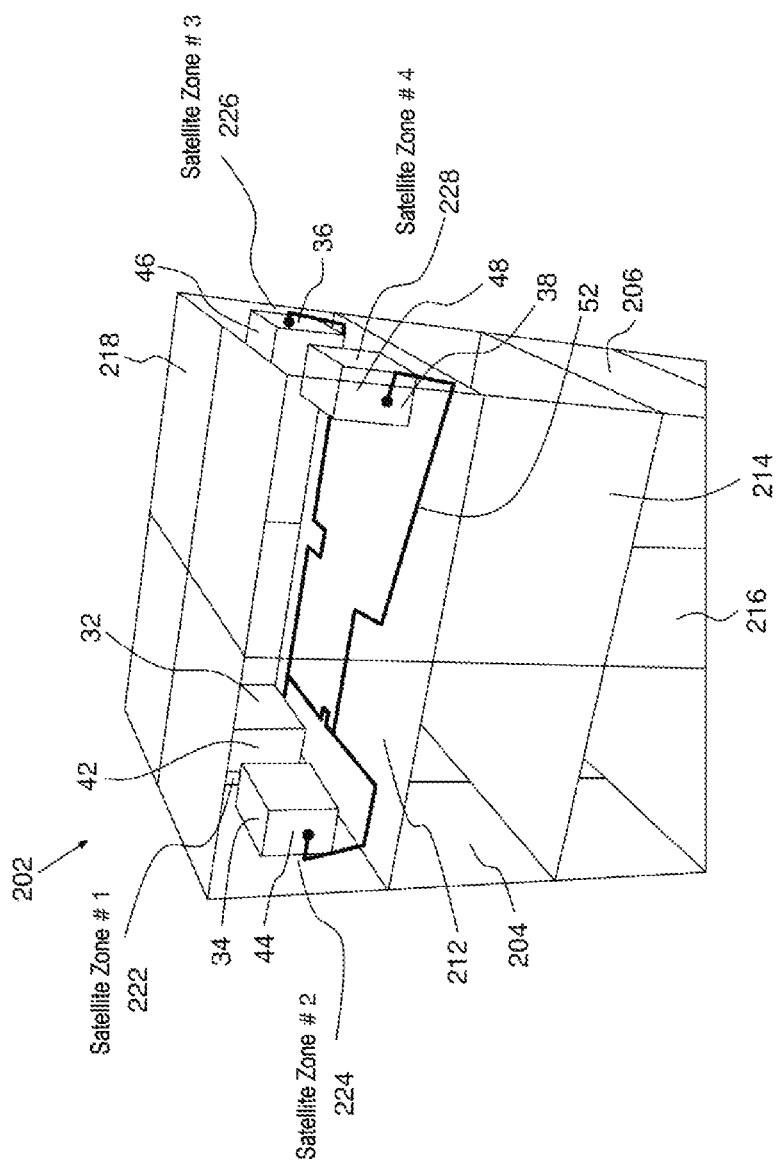
FIG. 3 is a view of the installation of the processing device of FIGS. 1 and 2 split up into islets and of the runs of the harness of the external optical links linking the islets together.

The installed space platform 202 also comprises here an intermediate panel 216, forming a stiffener oriented vertically in FIG. 3 and interposed between the first and second heat exchange panels 204, 206.

The installed space platform 202 also comprises here an end link panel 218 of the first and second heat exchange panels 212, 214, which is illustrated at the top of FIG. 3.

The islets of the digital processing device, that is to say the first, second, third, fourth modular sub-assemblies 32, 34, 36, 38, are distributed over the first heat exchange panel 204 and the second heat exchange panel 206, and are separated by the optical interconnection harness 52 whose run here passes through a floor over its length, here the first floor 212.

As a variant, the run passes through several floors.

Here, the first and second monobloc mechanical structures 42, 44 are disposed on the interior face of the first heat exchange panel 204 in a respective first "satellite zone" 222 and a respective second "satellite zone" 224. The third and fourth monobloc mechanical structures 46, 48 are disposed on the interior face of the second heat exchange panel 206 in a third "satellite zone" 226 and a fourth "satellite zone" 228 respectively.

In this configuration, the length of the links of the harness 52 separating the first modular sub-assembly 32 and the third, fourth modular sub-assemblies 36, 38 exceeds 4 metres. In addition to the geometric distance resulting from the locations of the modular sub-assemblies, the harness may be constrained in the routing to follow holes, predetermined or indeed normalized, passing through the floor panels and/or panels forming stiffening walls.

Thus, it is possible to lay out the various monobloc mechanical structures of the digital processing device in such a way that the layout is compatible with a platform's installation and thermal dissipation constraints.

Thus, fabrication and independent tests can be performed separately on the various islets. Thus, a test of the complete function of the digital processing device is made possible.

The various modular islets are mounted independently on the panels of the satellite and then connected by optical linkups, as if it entailed various items of equipment of the payload.

The invention claimed is:

1. A digital processing device, intended to be embedded aboard a space platform, with input/output connectivity, and having a multi-module modular architecture based on the use of one or more generic types of basic elementary modules, on one or more predetermined functionalities and on a connectivity matrix of predetermined size, comprising:
    a first plurality of input ports ($4_1, 4_2, \ldots, 4_{ne}$),
    a second plurality of output ports ($6_1, 6_2, \ldots, 6_{ns}$), and
    a third plurality of at least four basic elementary modules ($14_1, 14_2 \ldots, 14_k, 16_1, 16_2, \ldots 16_l, 18_1, 18_2, 18_3, \ldots, 18_m, 20_1, 20_2, \ldots, 20_n$), wherein:
        the third plurality of the elementary modules is split up according to a partitioning of at least two sub-assemblies of one or more modules ($14_1, 14_2 \ldots, 14_k, 16_1, 16_2, \ldots 16_l, 18_1, 18_2, 18_3, \ldots, 18_m, 20_1, 20_2, \ldots, 20_n$), each of the at least two sub-assemblies being integrated in a different monobloc mechanical structure; and
    at least two sub-assemblies of modules of the partitioning of the third plurality are sub-assemblies of at least two modules each defining a different islet of modules,
    the digital processing device comprises a harness of optical links for mutually interconnecting the sub-assemblies of modules whose interconnection lengths are compatible with external interconnection runs between two interconnected islets, which (i) avoid, by sidestepping, one or more items of equipment external to the digital processing device, and which are installed on the space platform and interposed between the two interconnected islets, or (ii) distribute at least two interconnected islets over two heat exchange zones of the space platform that are separated by a separation distance on the scale of the size of the platform, and
    at least one external interconnection length of the optical harness between two islets of modules is between 1 meter (m) and 50 m.

2. The digital processing device according to claim 1, wherein the at least one external interconnection length is between 1 m and 7 m.

3. The digital processing device according to claim 1, wherein:
    the third plurality of the elementary modules is split up according to a partitioning of at least two sub-assemblies of module(s), the partitioning containing at least two islets,
    the partitioning being determined so as to distribute the mass and the thermal power of the digital processing device over at least two heat exchange zones of the space platform which are separated by a separation distance on the scale of the size of the space platform.

4. The digital processing device according to claim 1, wherein the third plurality of the elementary modules is split up according to a partitioning containing only islets.

5. The digital processing device according to claim 1, wherein:
    the throughput per input port and per output port lies between 6 megabits per second (Mb/s) and 100 Mb/s, and
    a number of the input ports lies between 8 and 200, and a number of the output ports lies between 8 and 200, and a total number of the modules lies between 4 and 100, and a total number of the islets lies between 2 and 10.

6. The digital processing device according to claim 1, comprising at least two generic types of basic elementary modules, or a single generic type of basic elementary modules.

7. The digital processing device according to claim 1, being a processor included in the assembly formed by:
    the entirely digital processors of digital computer type, and
    the processors including at input one or more analog-to-digital converter (ADC) components for converting an analogue signal to a digital signal or at output one or more digital-to-analog (DAC) components for converting a digital signal to an analogue signal and entirely digital components for the remainder of the components.

8. The digital processing device according to claim 1, configured to be a digital transparent processor (DTP), a function of which is to provide flexibility in terms of connectivity, channelization, and frequency plan.

9. The digital processing device according to claim 1, wherein the harness of external optical links for interconnecting the islets is formed by optical fibres which are separated or grouped together by ribbon of a set of optical linkups.

10. An installed space platform comprising a digital processing device defined according to claim 1.

11. The space platform according to claim 10, comprising a first heat exchange panel and a second heat exchange panel, mutually separated by one or more floors, and wherein platform
    the islets of the digital processing device are distributed over the first heat exchange panel and the second heat exchange panel, and are separated by an optical interconnection harness whose run passes through at least one floor over its length.

* * * * *

UNITED STATES PATENT AND TRADEMARK OFFICE
CERTIFICATE OF CORRECTION

PATENT NO. : 10,664,423 B2
APPLICATION NO. : 15/987663
DATED : May 26, 2020
INVENTOR(S) : Hélène Gachon et al.

Page 1 of 1

It is certified that error appears in the above-identified patent and that said Letters Patent is hereby corrected as shown below:

In the Claims

In Claim 1, Column 9, Line 33, "$16_i$," should be --$16_1$--.
In Claim 1, Column 9, Line 38, "$16_i$," should be --$16_1$--.

Signed and Sealed this
Twenty-fourth Day of November, 2020

Andrei Iancu
*Director of the United States Patent and Trademark Office*